United States Patent
Bou Saada

(10) Patent No.: US 7,184,900 B2
(45) Date of Patent: Feb. 27, 2007

(54) METHOD OF MEASURING A MONOPHASE VOLTAGE

(75) Inventor: Johnny Bou Saada, Rixensart (BE)

(73) Assignee: Alstom Belgium S.A., Charleroi (BE)

( * ) Notice: Subject to any disclaimer, the term of this patent is extended or adjusted under 35 U.S.C. 154(b) by 0 days.

(21) Appl. No.: 11/045,478

(22) Filed: Jan. 31, 2005

(65) Prior Publication Data
US 2005/0182577 A1    Aug. 18, 2005

(30) Foreign Application Priority Data
Feb. 16, 2004    (EP) ................................. 04447042

(51) Int. Cl.
*G01R 15/00*    (2006.01)
(52) U.S. Cl. .................. 702/57; 702/64; 323/212; 327/156; 361/6
(58) Field of Classification Search .......... 702/57, 702/64; 323/212; 327/156; 361/6
See application file for complete search history.

(56) References Cited

U.S. PATENT DOCUMENTS

| | | | | |
|---|---|---|---|---|
| 4,525,686 A | * | 6/1985 | Yokoya | 331/17 |
| 4,930,064 A | * | 5/1990 | Tanaka et al. | 363/161 |
| 5,498,955 A | * | 3/1996 | Fujii et al. | 324/76.77 |
| 5,602,469 A | * | 2/1997 | Fujii et al. | 324/76.77 |
| 5,714,877 A | * | 2/1998 | Fujii et al. | 324/76.77 |
| 5,731,698 A | * | 3/1998 | Fujii et al. | 324/76.77 |
| 5,801,459 A | * | 9/1998 | Angquist | 307/125 |
| 5,808,462 A | * | 9/1998 | Fujii et al. | 324/76.13 |
| 5,869,800 A | * | 2/1999 | Buda et al. | 219/110 |
| 6,703,880 B1 | * | 3/2004 | Gailhard et al. | 327/159 |
| 2004/0021489 A1 | * | 2/2004 | Okui | 327/141 |

FOREIGN PATENT DOCUMENTS

FR    2 619 632 A1    2/1989

* cited by examiner

*Primary Examiner*—Carol S. W. Tsai
(74) *Attorney, Agent, or Firm*—Sughrue Mion, PLLC

(57) ABSTRACT

The present invention is related to a method for measuring the instantaneous value of a monophase AC voltage signal $V_e$, comprising the steps of:
- applying said voltage signal $V_e$ to a first input of a phase comparing circuit and a reference signal to a second input of said phase comparing circuit,
- in said phase comparing circuit deriving from the phase difference between said reference signal and said voltage signal $V_e$ a correction signal and outputting said correction signal,
- filtering said correction signal,
- using said filtered correction signal to adjust said reference signal,
- when the phase difference between said reference signal and said voltage signal $V_e$ is cancelled, determining the instantaneous value of said voltage signal $V_e$.

8 Claims, 1 Drawing Sheet

Mean value
Sine wave network    Rectifier signal

METHOD OF MEASURING A MONOPHASE VOLTAGE

FIELD OF THE INVENTION

The present invention is related to a method for measuring the instantaneous value of a mono-phase crest voltage.

STATE OF THE ART

To solve problems regarding the regulation of power systems operating in a mono-phase network, the knowledge of the instantaneous voltage of the fundamental is imperative. In a classical approach the measuring method consists in rectifying the mono-phase voltage and subsequently filtering the resulting signal. This method has two important drawbacks If the rectified voltage filtering is very weak, the voltage amplitude fluctuates over a small value as compared to the crest value.

Some filtering is recommended to obtain a stable read-out of the average value. However, if the filtering is too strong, the response time is too long to measure fast changes of the network voltage.

AIMS OF THE INVENTION

The present invention aims to provide a method for measuring the instantaneous value of a mono-phase crest voltage overcoming the problems of the prior art solutions.

SUMMARY OF THE INVENTION

The invention relates to a method for measuring the instantaneous value of a monophase crest voltage signal $V_e$, comprising the steps of applying the voltage signal $V_e$ to a first input of a phase comparing circuit and a reference signal to a second input of said phase comparing circuit, in the phase comparing circuit deriving from the phase difference between the reference signal and the voltage signal $V_e$ a correction signal and outputting the correction signal, filtering the correction signal, using the filtered correction signal to adjust the reference signal, when the phase difference between the reference signal and the voltage signal $V_e$ is cancelled, determining the instantaneous value of the voltage signal $V_e$ In a preferred embodiment the reference signal has a frequency of approximately 50 Hz.

Advantageously the step of filtering comprises a low-pass filtering followed by a PI regulation.

Preferably the correction signal is a linear combination of the product of the voltage signal $V_e$ and the cosine of the instantaneous phase of the reference signal and the product of the voltage signal $V_e$ and the sine of the instantaneous phase of the reference signal.

The invention also relates to a device for measuring the instantaneous value of a mono-phase crest voltage, carrying out the method as described above.

SHORT DESCRIPTION OF THE DRAWINGS

DETAILED DESCRIPTION OF THE INVENTION

Figure 1:
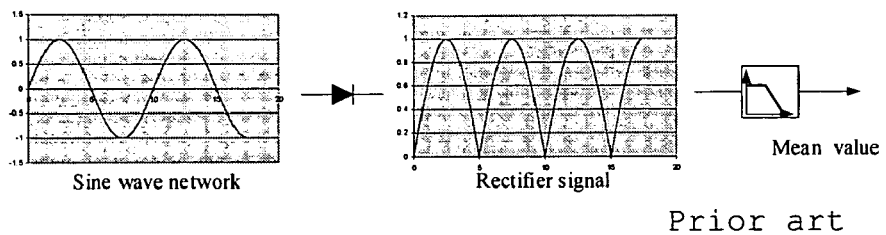
FIG. 1 represents the prior art approach.

FIG. 1 illustrates the prior art solution, wherein the mono-phase voltage signal is first rectified and subsequently filtered by a pass band filter.

In the method of the invention the instantaneous value of the mono-phase voltage is determined without the need for strong filtering.

The setting essentially comprises a Phase Locked Loop, needed to synchronise on the system. This avoids the need for searching the instant of zero pass of the AC voltage signal and the uncertainties that come along with it. In this way one obtains a sinusoidal phase reference inside the microprocessor reflecting the AC voltage phase present on the system. The voltage signal has a very good frequency stability. Therefore the Phase Locked Loop can be relatively slow, while still offering a very high operating stability.

The method is based on a digital reference based on which all projections will be undertaken. The digital reference of the system voltage preferably relates to the AC voltage $V_e$ itself for the following reasons:

it does not contain the harmonic of the system, not even the harmonic generated by the bridge itself.

it consists of two sine waves, one in phase and one in quadrature with the input voltage, which facilitates the calculation of the reactive and the active component of the current for example.

Figure 2:
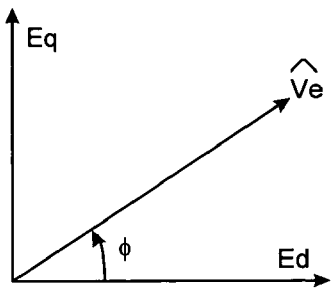
FIG. 2 represents the instantaneous phase of the voltage signal.

In order to obtain a reference vector having a relation to the input AC voltage, a phase locked loop is used. The fundamental equations of this loop are the following (see FIG. 2):

$$\begin{cases} Ed = \cos\theta \\ Eq = \sin\theta \end{cases}$$

with: $\theta = \int (\omega s + \epsilon) dt = \int \omega r \, dt$ whereby $\theta$ denotes the instantaneous phase of the rotating vector, such that Ed and Eq denote the instantaneous in-phase and quadrature components of the rotating (unit) vector, respectively. Further, $\omega_s$ denotes the approximate (and constant) reference pulsation of the 50 Hz system. $\epsilon$ represents the correction signal to the value of this theoretical pulsation $\omega_s$ and $\omega_r$ the resulting pulsation of the digital reference of the rotating vector.

Figure 3:
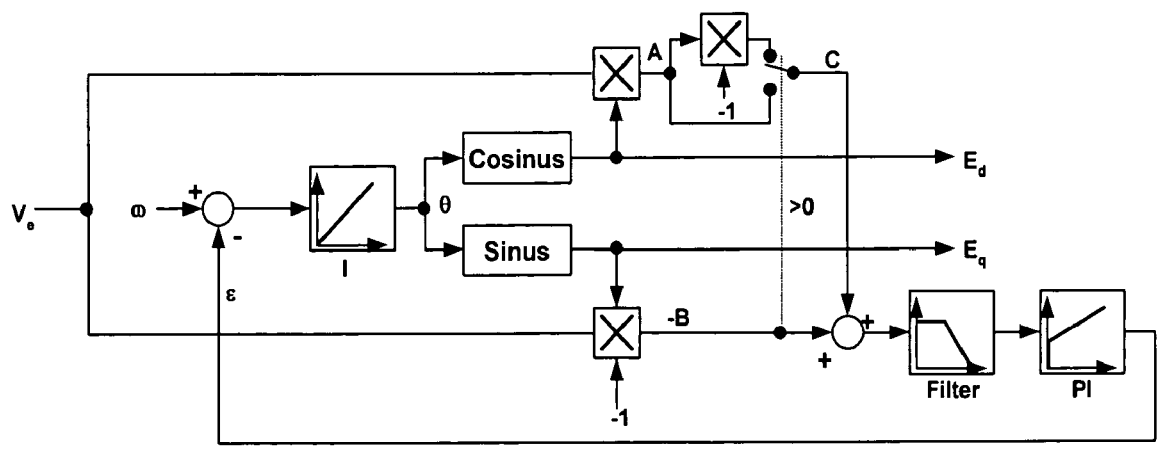
FIG. 3 represents the measuring method according to the invention.

The phase locked loop cancels the phase difference between the signal at pulsation ($\omega_s+\epsilon$) and the external input signal on which we want to synchronise ($V_e$ in this case). The signal at the reference pulsation $\omega_s$ is adjusted by adding or subtracting a value $\epsilon$ that depends on the phase difference between the reference signal and the input voltage (cfr. infra). The instantaneous phase of the resulting signal (at pulsation $\omega_r$) is determined and so one obtains (see FIG. 3):

$A = E_d \cdot V_e$ $B = E_q \cdot V_e$

Value A depends on the sine of the phase difference between the voltage $V_e$ and the internal reference sine wave. It is only used in case of large phase differences. B depends on the cosine of the phase difference. As the parameter A is only used for a big phase shift, only the negative value of A is used. In this way there is a privileged sense of rotation for the PI regulator in the PLL.

A value C is defined such that

C=0 if A>0

C=A if A<0

An input signal $e_k$ to the regulator is then calculated $e_k = -B+C$ if B>0

$e_k = -B-C$ if B<0

So the error to the regulator input $e_k$ takes different values according to the sign of A. This assures a continuous functioning of the system and prevents a synchronisation with the system to a phase difference of 180°.

A low-pass filter eliminates the double frequency component contained in $e_k$ resulting from the multiplication of the network sine wave and the reference pulsation. Most preferably next a PI regulator is used in the phase locked loop. At the PI regulator's output an error signal $\epsilon$ is obtained, given by $\epsilon = K_p \cdot e_k + \int K_i \cdot e_k$ $K_p$ and $K_i$ hereby denote the proportional and integral parameters of the regulator, respectively.

When, for example, the power is switched on and the input voltage undergoes a transient effect, the phase locked loop is in a non-synchronised transitory mode. To accomplish the PLL's synchronisation it is necessary to bring it into steady state regime (i.e. to render $\epsilon$ constant). $\epsilon$ is then kept constant by adding a high-pass filter (not shown in FIG. 3) and monitoring there is no AC signal at the high-pass filter's output.

Similarly, for security reasons associated with the PLL, the excursion $\epsilon$ should not exceed about thirty rad/s (tolerance of the 50 Hz system).

Figure 4:
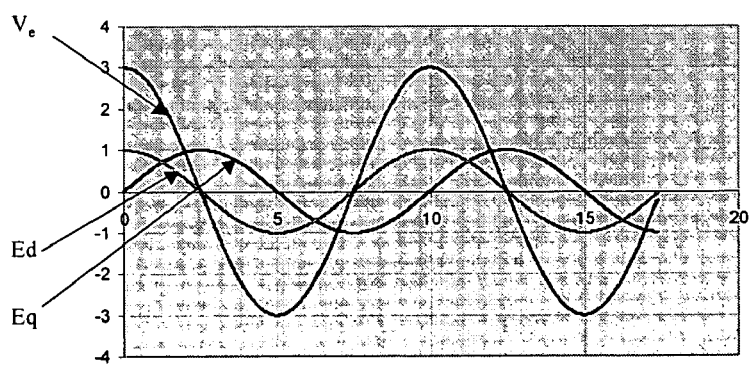
FIG. 4 shows how the crest value is obtained applying the method of the invention.

The voltage crest value can easily be obtained by an instantaneous voltage measurement (see also FIG. 4):

$$\hat{V}_e = \frac{V_e}{E_d}$$

The invention claimed is:

1. Method for measuring the instantaneous value of a monophase crest voltage signal $V_e$, comprising the steps of
    applying said voltage signal $V_e$ to a first input of a phase comparing circuit and a reference signal to a second input of said phase comparing circuit,
    deriving from the phase difference between said reference signal and said voltage signal $V_e$ in said phase comparing circuit a correction signal and outputting said correction signal,
    filtering said correction signal,
    using said filtered correction signal to adjust said reference signal,
    determining the instantaneous value of said voltage signal $V_e$, when the phase difference between said reference signal and said voltage signal $V_e$ is cancelled.

2. Method as in claim 1, wherein the step of filtering comprises a low-pass filtering followed by a PI regulation.

3. Method as in claim 1, wherein said correction signal is a linear combination of the product of said voltage signal $V_e$ and the cosine of the instantaneous phase of said reference signal and the product of said voltage signal $V_e$ and the sine of the instantaneous phase of said reference signal.

4. Method as in claim 1, wherein said reference signal has a frequency of approximately 50 Hz.

5. Device for measuring the instantaneous value of a mono-phase crest voltage, carrying out the method as in claim 1.

6. Method as in claim 2, wherein said correction signal is a linear combination of the product of said voltage signal $V_e$ and the cosine of the instantaneous phase of said reference signal and the product of said voltage signal $V_e$ and the sine of the instantaneous phase of said reference signal.

7. Method as in claim 3, wherein said reference signal has a frequency of approximately 50 Hz.

8. Device for measuring the instantaneous value of a mono-phase crest voltage, carrying out the method as in claim 3.

* * * * *